United States Patent
Sigmon

[19]

[11] Patent Number: 5,966,059
[45] Date of Patent: Oct. 12, 1999

[54] PHASE SHIFTING POWER COUPLER WITH THREE SIGNALS OF EQUAL AMPLITUDE

[75] Inventor: Bernard Eugene Sigmon, Gilbert, Ariz.

[73] Assignee: Motorola, Inc., Schaumburg, Ill.

[21] Appl. No.: 08/922,072

[22] Filed: Sep. 2, 1997

[51] Int. Cl.[6] .................................................. H01P 1/213
[52] U.S. Cl. ...................... 333/128; 333/136; 330/124 R
[58] Field of Search ..................................... 333/156, 161, 333/125, 127, 128, 136; 330/124 R

[56] References Cited

U.S. PATENT DOCUMENTS

| | | | |
|---|---|---|---|
| 4,223,283 | 9/1980 | Chan | 333/109 |
| 4,254,386 | 3/1981 | Nemit et al. | 333/128 |
| 4,263,559 | 4/1981 | Ho | 330/124 R X |
| 5,313,174 | 5/1994 | Edwards | 333/128 X |

Primary Examiner—Justin P. Bettendorf
Attorney, Agent, or Firm—Gregory J. Gorrie

[57] ABSTRACT

A three-way phase shifting power coupler (20) processes a primary signal (26) to provide first, second, and third secondary signals (32, 38, and 44) of substantially equal amplitudes. The first and second secondary signals (32 and 38) are phase shifted to be in-phase relative to the primary signal (26). The third secondary signal (44) is phase shifted to produce a quarter-wavelength difference between third secondary signal (44) and the first and second secondary signals (32 and 38). First, second, and third secondary signals (32, 38, and 44) are provided for distribution into a multi-stage amplifier (22). The power coupler (20) is preferably implemented in microstrip.

20 Claims, 2 Drawing Sheets

PHASE SHIFTING POWER COUPLER WITH THREE SIGNALS OF EQUAL AMPLITUDE

FIELD OF THE INVENTION

This invention relates generally to the field of power coupler devices, and more particularly, to power couplers which process one input signal into three output signals.

BACKGROUND OF THE INVENTION

In satellite telecommunication systems, it is desirable for RF power amplifiers to linearly amplify RF signals in a highly efficient manner. Doherty-type amplifiers are known to achieve an efficiency advantage over standard class AB and class B amplifiers near peak power, in part, because of an instantaneous modulation of their carrier amplifier's loadline as the RF input level changes. One type of high efficiency, linear power Doherty amplifier is a three stage amplifier, two stages that are carrier amplifier networks and one stage that is a peaking amplifier network.

This three stage implementation of a Doherty amplifier desirably requires a three-way power splitter with two of the three-way splits having equal amplitudes and phases, and the third split being of equal amplitude, but with a negative ninety degree phase offset with respect to the other two splits.

In the past, the power combiner/splitter function of a power coupler has been achieved by conventional and well-known methods which include the hybrid-ring couplers, the branch line coupler, in-line power splitter, the tee-combiner/divider, and the Wilkinson combiner/divider. These couplers typically divide one input signal into sub-signals through the use of a binary division scheme. Thus, a typical combiner/divider network uses a multiplicity of couplers, each of which converts an input signal into two output signals. Accordingly, such a coupler may divide an input signal into first and second intermediate signals. Another such coupler may then divide the first intermediate signal into third and fourth intermediate signals. Another such coupler may divide the second intermediate signal into fifth and sixth intermediate signals. This process of dividing one signal into two signals continues until a sub-signal for each stage of an amplifier system is provided.

A problem exists with this binary division scheme when an unequal number of signal inputs are needed for a downstream network, as in the three inputs needed for the three-stage Doherty amplifier. This is because an input signal is first divided into two intermediate signals, but only one of the two intermediate signals need be divided to produce the three secondary signals for the three-stage Doherty amplifier. So, while three secondary signals can be produced, there will be an unequal power division between them.

One prior art power coupler for accomplishing three-way power division and combination is a modified form of the hybrid-ring coupler. This modified hybrid-ring coupler system uses distributed, quarter-wave length tuning elements to achieve a three-way, equal phase power division. Unlike the familiar hybrid ring, extra line lengths are provided so that three output ports and a composite or input port are provided in addition to two isolation ports. The device is inherently reciprocal, a signal at the composite port being split three ways, substantially one-third of the power appearing at each of the three output ports. Associated line lengths between the various ports are adjusted such that signals are in-phase at the output ports and cancel at the isolation ports so that the divided energy appears in equal phase as well as equal amplitude. The problem arises when attempting to implement this power coupler with the three-stage Doherty amplifier because this modified hybrid-ring coupler system produces three secondary signals that are in-phase. This is directly counterproductive to the proper function of the Doherty amplifier, where one secondary signal is needed that desirably lags ninety degrees out of phase relative to the other two secondary signals.

To overcome the problem of in-phase output signals, such as that seen in the modified hybrid-ring coupler system, lines of sufficient length may be added to achieve the desired phase relationships between the individual output signals. Such an arrangement requires an inefficiency of layout space which adversely affects size and weight of the power coupler. Furthermore, this arrangement increases circuit losses due to the relatively large circuit path lengths required for implementation.

Another power coupler provides three properly phased, equal amplitude output signals in response to one input signal. The physical implementation of this power coupler is a waveguide system. This system is suitable when there is unlimited implementation space. However, in applications such as satellite systems, antenna systems, and so forth, waveguide systems may not be desirable due to their inherently large physical characteristics. Furthermore, waveguide systems are less efficient which may result in undesirable circuit losses of the input signal.

Thus what is needed is a three-way phase shifting power coupler that splits or combines input signals efficiently and simply. Furthermore, what is needed is a power coupler that can split one input signal into three equal amplitude output signals, two output signals being in-phase with the input signal, and the third output signal being shifted in phase relative to the other two output signals, that can be implemented with a three stage Doherty-type amplifier.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE DRAWINGS

Figure 1:
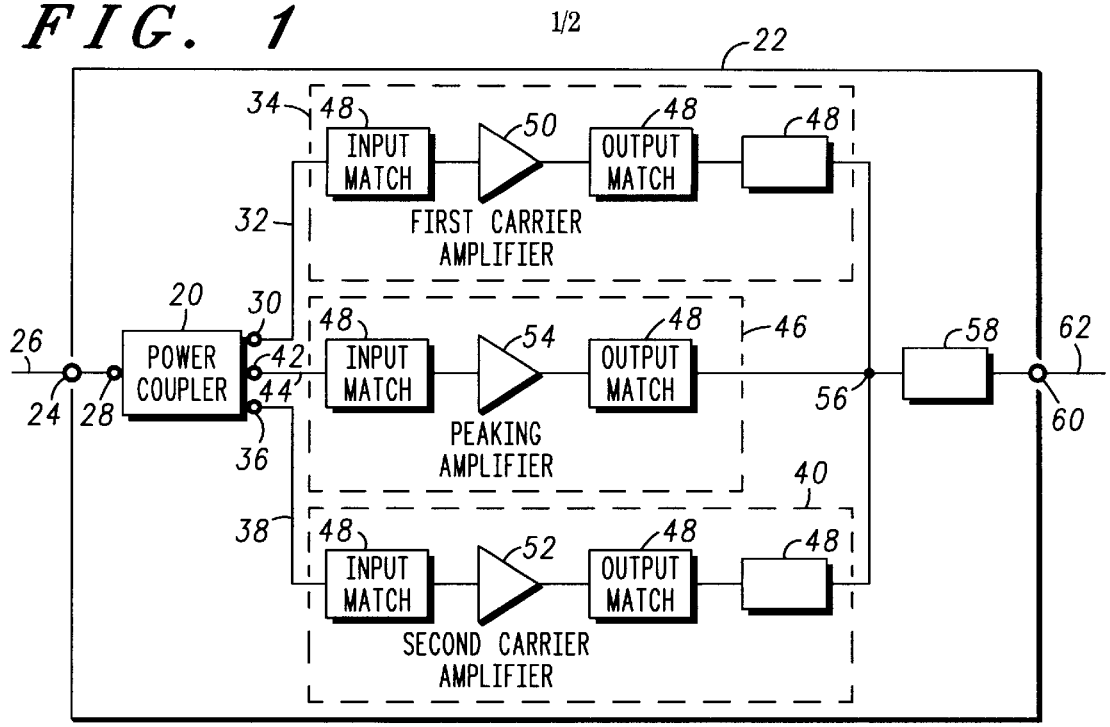
FIG. 1 shows a block diagram of a three-way phase shifting power coupler implemented within a multi-stage Doherty-type power amplifier in accordance with a preferred embodiment of the present invention.

FIG. 1 shows a block diagram of a three-way phase shifting power coupler 20 implemented within a multi-stage Doherty-type power amplifier 22 in accordance with a preferred embodiment of the present invention. Amplifier 22 includes input port 24 for receiving a primary signal 26. Primary signal 26 is an RF input signal which may be amplitude or frequency modulated, or bauded such as a quadrature phase shift keyed signal, or any combination of these, including multi-carrier input signals.

Multi-stage Doherty-type power amplifier 22 inclusive of power coupler 20 uses planar microstip in a distributed topology, as opposed to lumped components. This results in reduced production costs and improved reliability due to fewer components, fewer wire bonds, and more manufacturably repeatable circuits.

Power coupler 20, having a primary port 28 coupled to input port 24, is a three-way equal amplitude power splitter, in the preferred embodiment. Power coupler 20 has three output ports. A first secondary port 30 provides a first secondary signal 32 to a first carrier amplifier network 34 of Doherty-type amplifier 22. Likewise, a second secondary port 36 provides a second secondary signal 38 to a second carrier amplifier network 40, and a third secondary port 42 provides a third secondary signal 44 to a peaking amplifier network 46 of Doherty-type amplifier 22. Those skilled in the art will readily recognize that first, second, and third secondary signals 32, 38, and 44, respectively, are RF signals that are carried on transmission lines between power coupler 20 and the three amplifier stages of Doherty-type amplifier 22. Reference to first, second, and third secondary signals 32, 38, and 44, respectively, are directed to respective transmission lines for clarification of the description herein.

First carrier amplifier network 34 includes input and output matching elements 48 and a first carrier amplifier 50. Likewise, second carrier amplifier network 40 includes input and output matching elements 48 and a second carrier amplifier 52, and peaking amplifier network 46 includes input and output matching elements 48 and a peaking amplifier 54. Input and output matching elements 48 provide for appropriate phase shifting and impedance matching. Additionally, elements 48 do not have identical characteristics for each of first and second carrier amplifier networks 34 and 40, respectively, and for peaking amplifier 46. Specific knowledge of input and output matching elements 48 is not necessary for the understanding of power coupler 20, therefore, elements 48 will not be described in detail herein.

The three amplifier stages of Doherty-type amplifier 22, i.e. first carrier amplifier network 34, second carrier amplifier network 40, and peaking amplifier network 46, desirably need equal amplitude signals. Furthermore, first and second carrier amplifier networks 34 and 43, respectively, desirably need equal phases while peaking amplifier network 46 is approximately ninety degrees out of phase relative to first and second carrier amplifier networks 34 and 43. The equivalent partitioning of amplitude and appropriate phase shifting of the input signals into multi-stage amplifier 22 is desirable in order to improve the overall efficiency of multi-stage amplifier 22.

First carrier amplifier 50 is biased to amplify in the presence of first secondary signal 32 having "low" signal levels, as second carrier amplifier 52 and peaking amplifier 54 are biased off. Similarly, second carrier amplifier 52 amplifies in the presence of second secondary signal 38 having "medium" signal levels such as at a level occurring when first carrier amplifier 50 has been amplifying and is approaching or has reached saturation. Finally, peaking amplifier 54 amplifies in the presence of third secondary signal 44 having "high" power level signals such as those that occur when second carrier amplifier 52 has been amplifying and is approaching or has reached saturation.

Output signals (not shown) from first carrier network 34, second carrier network 40, and peaking amplifier network 46 are combined at a combiner 56. As a result of processing occurring in each of first and second carrier amplifier networks 34 and 40, respectively, and peaking amplifier network 46, all of the signals at combiner 56 are in-phase with each other and are driven to an impedance transformer 58 for matching with a load at an output 60 to produce an amplified RF output signal 62.

Figure 2:
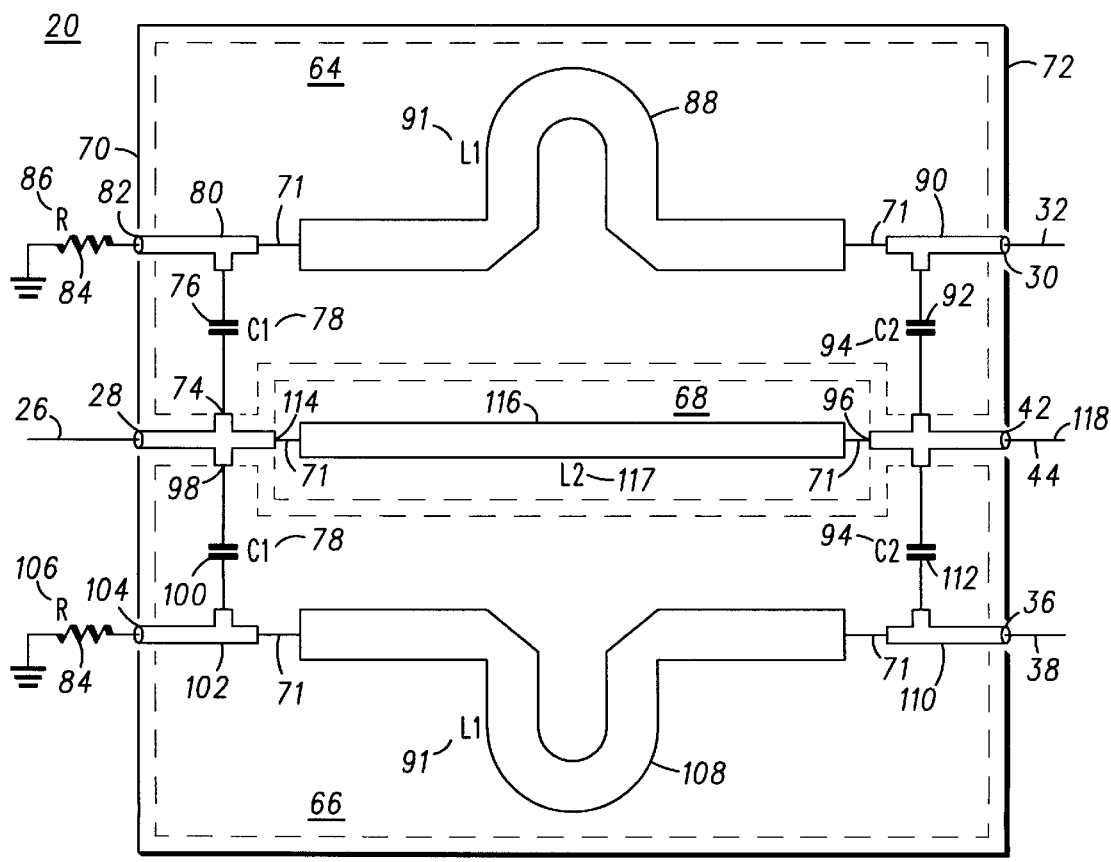
FIG. 2 shows a schematic representation of the three-way phase shifting power coupler in accordance with a preferred embodiment of the present invention.

FIG. 2 shows a schematic representation of three-way phase shifting power coupler 20 in accordance with a preferred embodiment of the present invention. Power coupler 20 functions as a power splitter in Doherty-type amplifier 22 (FIG. 1). However, those skilled in the art will recognize that power coupler 20 is entirely reciprocal and therefore capable of combining signals applied at first, second, and third secondary ports 30, 36, and 42, respectively, to provide a primary signal at primary port 28. The primary signal will then have a magnitude equal to the sum of those applied at first, second, and third secondary ports 30, 36, and 42, respectively, minus a minimal amount of inherent loss.

Power coupler 20 is made up of a first circuit 64, a second circuit 66, and a third circuit 68. In the preferred embodiment, power coupler 20 is implemented in a microstrip topology 70 and each of first, second, and third circuits 64, 66, and 68 are made up of printed conductors 71 on an insulating substrate 72 of microstrip topology 70. Those skilled in the art will realize that insulating substrate 72 is backed (beneath substrate 72) by a conductive ground plane (not shown) according to well-known microstrip construction techniques. Typical materials for insulating substrate 72 include plastic insulating materials (e.g., TEFLON®). fiberglass and alumina. Such substrate materials exhibit low tangential loss and are readily fabricated to provide a uniform dielectric constant, thereby increasing circuit reliability. Microstrip techniques are well known and will not be described in detail herein.

First circuit 64 has a first primary end 74 coupled to primary port 28. A first capacitor 76 of first circuit 64 is coupled to first primary end 74. First capacitor 76 exhibits a first capacitance 78 and has a first terminal end 80. A first port 82 is located at first terminal end 80. A first resistor 84 exhibits a resistance 86 and is coupled to first circuit 64 at first port 80. First resistor 84 is configured to terminate first circuit 64 to the conductive ground plane (not shown).

First circuit 64 also includes a first inductor element 88 coupled between first terminal end 80 and a first secondary end 90. First inductor element 88 exhibits an inductance 91. A second capacitor 92 exhibits a second capacitance 94 and couples to a third secondary end 96 of third circuit 68. First secondary end 90 couples to first secondary port 30 to complete a transmission path for first secondary signal 32.

Second circuit 66 has a second primary end 98 coupled to primary port 28. A third capacitor 100 of second circuit 66 is coupled to second primary end 98. Third capacitor 100 exhibits capacitance 78 and has a second terminal end 102. A second port 104 is located at second terminal end 102. A second resistor 106 exhibits resistance 86 and is coupled to second circuit 66 at second port 104. Second resistor 106 is configured to terminate second circuit 66 to the conductive ground plane (not shown).

Second circuit 66 also includes a second inductor element 108 coupled between second terminal end 102 and a second secondary end 110. Second inductor element 108 exhibits inductance 91. A fourth capacitor 112 exhibits second capacitance 94 and couples to third circuit 68 at third secondary end 96. Second secondary end 110 couples to second secondary port 36 to complete a transmission path for second secondary signal 38.

Third circuit 68 has a third primary end 114 coupled to primary port 28. Third circuit 68 is made up of a third inductor element 116 coupled between third primary end 114 and third secondary end 96. Third inductor element 116 exhibits an inductance 117. Third secondary end 96 couples to third secondary port 42 to complete a transmission path for third secondary signal 44.

In the preferred embodiment, first, second, third, and fourth capacitors 76, 100, 92, and 112, respectively are selected so that first and second capacitances 78 and 94, respectively, are substantially equal. This selection is desirably made so that each of first, second, and third secondary signals 32, 38, and 44, respectively are of substantially equal amplitudes.

Since power coupler 20 is implemented in microstrip topology, inductance 91 for first and second inductor elements 88 and 108, respectively, and inductance 117 for third inductor element 116 is produced by determining an overall length and width in each of the transmission paths in microstip topology 70.

When an imaginary axis 118 is overlaid along the length of third circuit 68, it becomes readily apparent that second circuit 66 is symmetrical relative to first circuit 64. In other words, second circuit 66 is a mirror image of first circuit 64 about imaginary axis 118. This layout results in a simple and efficient configuration that reduces design complexity, size, and weight which ultimately reduces costs while increasing circuit reliability.

An optimal selection of components for each of first, second, and third circuits, 64, 66, and 68, respectively, results in power coupler 20 splitting primary signal 26 into three secondary signals of substantially equal amplitudes. Furthermore, inductance 91, in combination with the other components previously described that make up first and second circuits 64 and 66, respectively, are configured to phase shift first and second secondary signals 32 and 38, respectively, to be in-phase with primary signal 26. Finally, inductance 117 of third circuit 68 is configured to phase shift third secondary signal 44 to lag a quarter-wavelength from first and second secondary signals 32 and 38, respectively.

Figure 3:
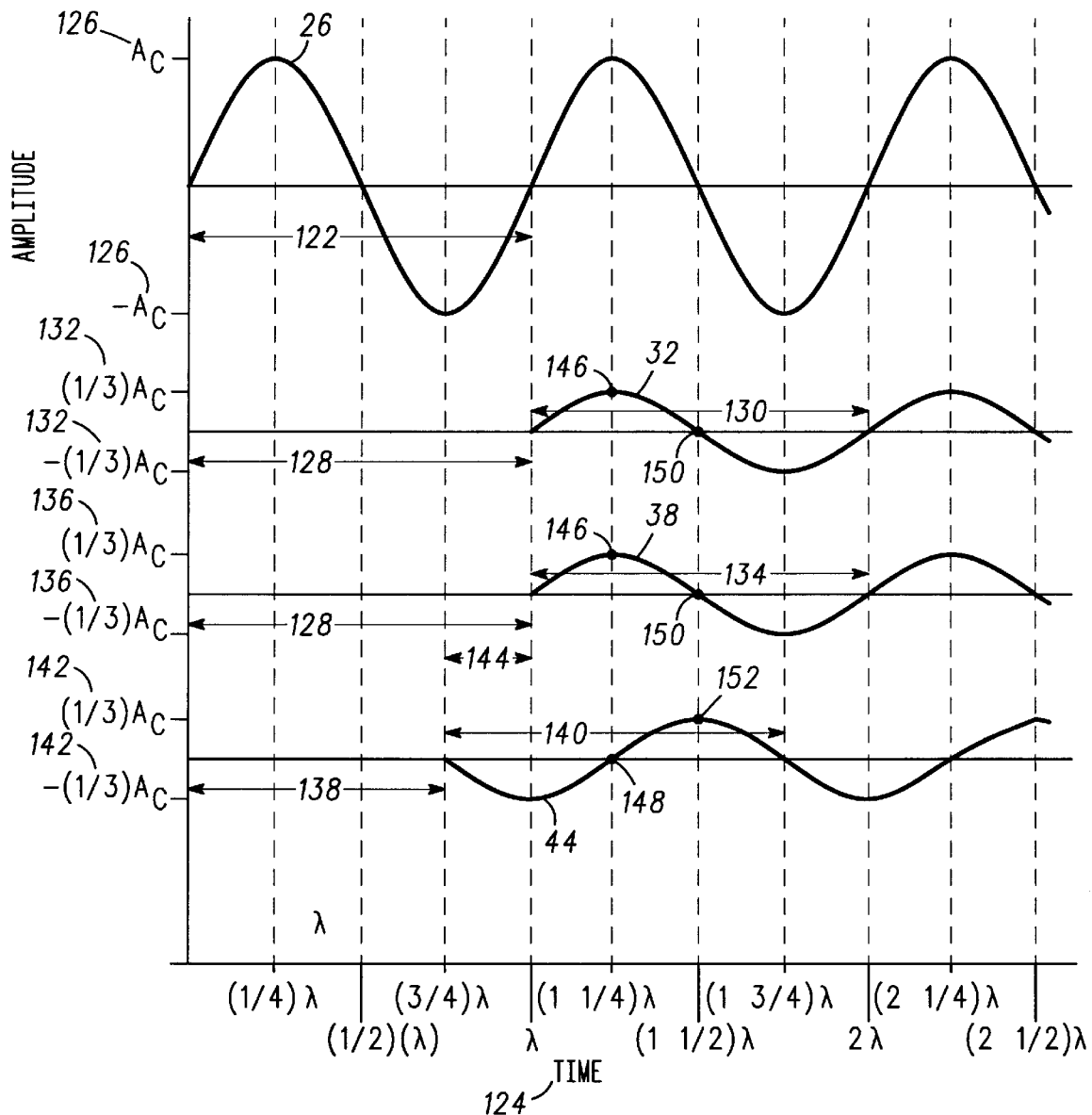
FIG. 3 shows a graph of the phase and amplitude relationships between a primary signal and three secondary signals in accordance with a preferred embodiment of the present invention.

FIG. 3 shows a graph 120 of the phase and amplitude relationships between primary signal 26 and first, second, and third secondary signals 32, 38, and 44, respectively, in accordance with a preferred embodiment of the present invention. Graph 120 is illustrated to clarify relationships between the amplitudes and phase shifts that result from power coupler 20 (FIG. 1).

Primary signal 26 exhibits a primary phase 122 that is shown relative to quarter-wavelength time indices 124. Primary signal 26 also exhibits a primary amplitude $(+/-A_c)$ 126. First circuit 64 (FIG. 2) delays first secondary signal 32 by a first phase delay 128 which causes first secondary signal 32 to exhibit a first phase 130 at a first amplitude $(+/-(\frac{1}{3})A_c)$ 132. Likewise, due to the symmetry described above, second circuit 66 (FIG. 2) delays second secondary signal 38 by first phase delay 128 which causes second secondary signal 38 to exhibit a second phase 134 at a second amplitude $(+/-(\frac{1}{3})A_c)$ 136. Finally, third circuit 68 (FIG. 2) delays third secondary signal 44 by a second phase delay 138 which causes third secondary signal 44 to exhibit a third phase 140 at a third amplitude $(+/-(\frac{1}{3})A_c)$ 142.

As shown in graph 120, power coupler 20 causes signal splitting such that first, second and third amplitudes 132, 136, and 142 are substantially equal and are each approximately one third of primary amplitude 126. Those skilled in the art will recognize that each of first, second, and third amplitudes 132, 136, and 142, respectively, may likely be slightly less than one third of primary amplitude 126 due to some inherent signal loss that may occur as the signals are transmitted through first, second, and third circuits 64, 66, and 68, respectively.

Graph 120 also depicts the resulting phase relationships of first, second, and third secondary signals 32, 38, and 44, respectively, relative to primary signal 26. In a preferred embodiment of the present invention, first phase delay 128 causes first and second phases 130 and 134, respectively, to be in-phase with primary phase 122. Graph 120 illustrates first phase delay 128 as a one-wavelength delay, however, those skilled in the art will recognize that first phase delay 128 need not be exactly one-wavelength, but may be any phase delay that results in first and second phases 130 and 134, respectively, being in-phase with primary phase 122.

Second phase delay 138 delays third secondary signal 44 to produce an approximately quarter-wavelength phase difference 144 between first secondary signal 32 and third secondary signal 44, and between second secondary signal 38 and third secondary signal 44. In other words, third phase 140 lags first and second phases 130 and 134, receptively, by quarter-wavelength phase difference 144. Furthermore, since first and second phases 130 and 134, respectively, are in-phase with primary phase 122, third phase 140 also lags primary phase 122 by quarter-wavelength phase difference 144.

To further clarify the preceding discussion, the following phase difference examples are cited from graph 120. When first and second phases 130 and 134 correspond to a 90 degree position 146, third phase 140 corresponds to a 0 degree position 148. When first and second phases 130 and 134 correspond to a 180 degree position 150, third phase 140 corresponds to a 90 degree position 152, and so forth. The appropriately phased first, second, and third secondary signals 32, 38, and 44, respectively, are then provided as input signals to multi-stage Doherty-type power amplifier 22 (FIG. 1) in accordance with a preferred embodiment.

In a preferred embodiment, a microstip implementation of power coupler 20 is designed for primary signal 26 (FIG. 2) having a frequency of 1.62 GHz. Microstrip topology 70 (FIG. 2) includes a dielectric media with a dielectric constant of 9.8. The thickness of insulating substrate 72 (FIG. 2) is preferably approximately 0.025 inches. A microwave analysis program may be used to calculate for the desired capacitance and inductance. A value of fifty ohms is determined to be sufficient resistance 86 (FIG. 2) for first and second resistors 86 and 106, respectively, to dissipate reflected power from first, second, and third secondary ports 30, 36, and 42. Additionally, known and constant inductance is assumed for junctions of transmission paths, path lengths, and the inductance inherent in resistors when primary signal 26 is a high frequency RF input.

Referring back to FIG. 2, simulation of power coupler 20 results in first and second inductor elements 88 and 108, respectively, having a width of 850 microns and a length of 9500 microns to produce inductance 91. Likewise third inductor element 116 has a width of 525 microns and a length of 5350 microns producing inductance 117. First and second capacitors 76 and 100, respectively have first capacitance 78 of approximately 1.81 pf. Third and fourth capacitors 92 and 112, respectively, have second capacitance 94 of 1.81 pf. These inductances and capacitances result in first, second, and third secondary signals 32, 38, and 44, respectively, all of equal amplitudes, and third secondary signal 44 having a ninety degree phase lag relative to first and second secondary signals 32 and 38, respectively.

The embodiment discussed above is planar microstip in a distributed topology, as opposed to lumped components.

This results in reduced production costs, improved reliability, and smaller size due to fewer components, fewer wire bonds, and more manufacturably repeatable circuits. However, any or all components of power coupler 20 may be built using lumped elements.

In summary, the present invention incorporates a topology that efficiently couples RF signal inputs. Specifically, the present invention is configured to produce three secondary signals from one primary signal. All three of the secondary signals have substantially equal amplitudes and two of the secondary signals are in-phase relative to the primary signal while the third secondary signal lags a quarter-wavelength from the other two secondary signals. The present invention may be implemented within a multi-stage Doherty-type amplifier configuration that efficiently amplifies and combines the three secondary signals into a single output signal.

Furthermore, other than equal amplitude splits can be achieved by manipulation of the inductance and capacitance values to adapt the present invention to newly developing multi-stage amplifier systems. In yet another application, the present invention can be implemented in reciprocal fashion whereby three secondary signals can be input into the invention to produce one primary signal.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A three-way phase shifting power coupler comprising:
   a primary port for receiving said primary signal, said primary signal exhibiting a primary phase;
   a first secondary port for providing a first secondary signal of said primary signal, said first secondary signal exhibiting a first phase relative to said primary phase;
   a second secondary port for providing a second secondary signal of said primary signal, said second secondary signal exhibiting a second phase relative to said primary phase; and
   a third secondary port for providing a third secondary signal of said primary signal, said third secondary signal exhibiting a third phase relative to said primary phase,
   wherein said first and second phases are substantially in-phase with said primary phase, said first and second secondary signals exhibiting substantially the same phase delay through the power coupler relative to the primary phase of said primary signal, and wherein said third phase lags said said primary phase by approximately ninety degrees,
   and wherein said first secondary signal exhibits a first amplitude;
   said second secondary signal exhibits a second amplitude; and
   said third secondary signal exhibits a third amplitude, said first, second, and third amplitudes being substantially equal.

2. A power coupler as claimed in claim 1 wherein said first and second secondary signals exhibit a substantially one-wavelength phase delay relative to said primary phase of said primary signal.

3. A power coupler as claimed in claim 1 wherein said power coupler further comprises:
   a first circuit having a first primary end coupled to said primary port and a first secondary end coupled to said first secondary port;
   a second circuit having a second primary end coupled to said primary port and a second secondary end coupled to said second secondary port; and
   a third circuit having a third primary end coupled to said primary port and a third secondary end coupled to said third secondary port.

4. A three-way phase shifting power coupler comprising:
   a primary port for receiving said primary signal, said primary signal exhibiting a primary phase;
   a first secondary port for providing a first secondary signal of said primary signal, said first secondary signal exhibiting a first phase relative to said primary phase;
   a second secondary port for providing a second secondary signal of said primary signal, said second secondary signal exhibiting a second phase relative to said primary phase; and
   a third secondary port for providing a third secondary signal of said primary signal, said third secondary signal exhibiting a third phase relative to said primary phase,
   wherein said first and second phases are substantially in-phase, and wherein said third phase lags said first and second phases by approximately ninety degrees,
   and wherein:
   said primary signal has a primary signal amplitude;
   said first secondary signal exhibits a first amplitude;
   said second secondary signal exhibits a second amplitude; and
   said third secondary signal exhibits a third amplitude, said first, second, and third amplitudes being substantially equal and approximately one-third of said primary signal amplitude.

5. A three-way phase shifting power coupler for processing a primary signal, said power coupler comprising:
   a primary port for coupling said primary signal with first, second, and third secondary signals;
   a first circuit having a first primary end coupled to said primary port and a first secondary end, said first circuit being configured to phase shift said first secondary signal by a first phase delay;
   a second circuit having a second primary end coupled to said primary port and a second secondary end, said second circuit being configured to phase shift said second secondary signal of said primary signal by substantially said first phase delay, and said second circuit being symmetrical relative to said first circuit; and
   a third circuit having a third primary end coupled to said primary port and a third secondary end, said third circuit being configured to phase shift said third secondary signal of said primary signal by a second phase delay, said second phase delay lagging said first phase delay by approximately ninety degrees,
   wherein the first phase delay is substantially one-wavelength, and wherein said first, second and third secondary signals are substantially equal in amplitude.

6. A three-way phase shifting power coupler for processing a primary signal, said primary signal exhibiting a primary phase, and said power coupler comprising:
   a primary port for receiving said primary signal;
   a first secondary port for providing a first secondary signal of said primary signal, said first secondary signal exhibiting a first phase relative to said primary phase;
   a second secondary port for providing a second secondary signal of said primary signal, said second secondary signal exhibiting a second phase relative to said primary phase;

a third secondary port for providing a third secondary signal of said primary signal, said third secondary signal exhibiting a third phase relative to said primary phase, said third phase being unequal to said first and second phases;

a first circuit having a first primary end coupled to said primary port and a first secondary end coupled to said first secondary port;

a second circuit having a second primary end coupled to said primary port and a second secondary end coupled to said second secondary port;

a third circuit having a third primary end coupled to said primary port and a third secondary end coupled to said third secondary port;

a first capacitor coupled to said first primary end and having a first terminal end;

a first port located at said first terminal end;

a first inductor element coupled between said first terminal end and said first secondary end; and a second capacitor coupled between said first secondary end and said third secondary end.

7. A power coupler as claimed in claim 6 wherein said power coupler further comprises a first resistor coupled to said first port and configured to terminate said first circuit.

8. A power coupler as claimed in claim 6 wherein said second circuit further comprises:

a third capacitor coupled to said second primary end and having a second terminal end;

a second port located at said second terminal end;

a second inductor element coupled between said second terminal end and said second secondary end; and a fourth capacitor coupled between said second secondary end and said third secondary end.

9. A power coupler as claimed in claim 8 wherein said power coupler further comprises a second resistor coupled to said second port and configured to terminate said second circuit.

10. A power coupler as claimed in claim 6 wherein said third circuit further comprises a third inductor element coupled between said third primary end and said third secondary end.

11. A power coupler as claimed in claim 6 wherein:

said power coupler is implemented in a microstrip topology;

each of said first, second, and third circuits comprises printed conductors on an insulating substrate of said microstrip topology; and said second circuit is configured to be symmetrical relative to said first circuit.

12. A three-way phase shifting power coupler for processing a primary signal, said power coupler comprising:

a primary port for coupling said primary signal with first, second, and third secondary signals;

a first circuit having a first primary end coupled to said primary port and a first secondary end, said first circuit being configured to phase shift said first secondary signal by a first phase delay;

a second circuit having a second primary end coupled to said primary port and a second secondary end, said second circuit being configured to phase shift said second secondary signal of said primary signal by substantially said first phase delay, and said second circuit being symmetrical relative to said first circuit; and a third circuit having a third primary end coupled to said primary port and a third secondary end, said third circuit being configured to phase shift said third secondary signal of said primary signal by a second phase delay, said second phase delay lagging said first phase delay by approximately ninety degrees, and wherein said second phase delay is configured to produce an approximately quarter-wavelength phase difference between said first secondary signal and said third secondary signal, and to produce said approximately quarter-wavelength phase difference between said second secondary signal and said third secondary signal, and wherein said first phase delay is in-phase with said primary signal at said primary port, and wherein said first, second and third secondary signals are substantially equal in amplitude and approximately one-third an amplitude of said primary signal at said primary port.

13. A power coupler as claimed in claim 12 wherein said power coupler is implemented in microstrip, and each of said first, second, and third circuits comprise printed conductors on an insulating substrate.

14. A three-way phase shifting power coupler for processing a primary signal, said power coupler comprising:

a primary port for coupling said primary signal with first, second, and third secondary signals;

a first circuit having a first primary end coupled to said primary port and a first secondary end, said first circuit being configured to phase shift said first secondary signal by a first phase delay;

a second circuit having a second primary end coupled to said primary port and a second secondary end, said second circuit being configured to phase shift said second secondary signal of said primary signal by substantially said first phase delay, and said second circuit being symmetrical relative to said first circuit;

a third circuit having a third primary end coupled to said primary port and a third secondary end, said third circuit being configured to phase shift said third secondary signal of said primary signal by a second phase delay, said second phase delay being unequal to said first phase delay;

wherein said first circuit comprises:

a first capacitor coupled to said first primary end and having a first terminal end, said first capacitor exhibiting a first capacitance;

a first port coupled to said first terminal end;

a first inductor element coupled between said first terminal end and said first secondary end, said first inductor element exhibiting an inductance; and a second capacitor coupled between said first secondary end and said third secondary end, said second capacitor exhibiting a second capacitance.

15. A power coupler as claimed in claim 14 wherein said second circuit comprises:

a third capacitor coupled to said first primary end and having a second terminal end, said third capacitor exhibiting said first capacitance;

a second port coupled to said second terminal end;

a second inductor element coupled between said second terminal end and said second secondary end, said second inductor element exhibiting said inductance; and a fourth capacitor coupled between said second secondary end and said third secondary end, said fourth capacitor exhibiting said second capacitance.

16. A power coupler as claimed in claim 15 wherein said first and second capacitances are substantially equal.

17. A power coupler as claimed in claim 15 further comprising:
- a first resistor coupled to said first port, said first resistor exhibiting a resistance; and
- a second resistor coupled to said second port, said second resistor exhibiting said resistance.

18. A power coupler as claimed in claim 15 wherein said third circuit comprises an inductor element coupled between said third primary end and said third secondary end.

19. A three-way phase shifting power splitter for dividing a primary signal into first, second, and third secondary signals, each of said secondary signals being input into a multi-stage power amplifier; said power splitter comprising:
- a primary port for receiving said primary signal, said primary signal exhibiting a primary phase and a primary amplitude;
- a first circuit having a first primary end coupled to said primary port for receiving said first secondary signal, said first secondary signal exhibiting an amplitude that is approximately one third of said primary amplitude, and said first circuit being configured to cause said first secondary signal to be in-phase with said primary phase;
- a first secondary port coupled to said first circuit for providing said first secondary signal;
- a second circuit having a second primary end coupled to said primary port for receiving said second secondary signal, said second secondary signal exhibiting substantially said amplitude, and said second circuit being configured to cause said second secondary signal to be in-phase with said primary phase;
- a second secondary port coupled to said second circuit for providing said second secondary signal;
- a third circuit having a third primary end coupled to said primary port for receiving said third secondary signal, said third secondary signal exhibiting substantially said amplitude, and said third circuit being configured to cause said third secondary signal to lag a quarter-wavelength from said primary phase; and
- a third secondary port coupled to said third circuit for providing said third secondary signal; wherein
  - said first secondary signal is input into a first carrier amplifier network of said multi-stage power amplifier;
  - said second secondary signal is input into a second carrier amplifier network of said multi-stage power amplifier; and
  - said third secondary signal is input into a peaking amplifier network of said multi-stage power amplifier.

20. A power splitter as claimed in claim 19 wherein:
- said first circuit comprises a first port, said first port being configured to provide a resistance to said first circuit; and
- said second circuit comprises a second port, said second port being configured to provide said resistance to said second circuit.

* * * * *